United States Patent [19]

Liu

[11] Patent Number: 6,071,805

[45] Date of Patent: Jun. 6, 2000

[54] AIR GAP FORMATION FOR HIGH SPEED IC PROCESSING

[75] Inventor: Erzhuang Liu, Singapore, Singapore

[73] Assignee: Chartered Semiconductor Manufacturing, Ltd., Singapore, Singapore

[21] Appl. No.: 09/236,493

[22] Filed: Jan. 25, 1999

[51] Int. Cl.$^7$ .............................................. H01L 21/4763
[52] U.S. Cl. ...................... 438/619; 438/411; 438/421; 438/422; 438/598; 438/637; 438/667; 438/669
[58] Field of Search .................................... 438/355, 359, 438/411, 421, 422, 424, 598, 619, 637, 667, 669

[56] References Cited

U.S. PATENT DOCUMENTS

| | | | |
|---|---|---|---|
| 3,932,226 | 1/1976 | Klatskin et al. | 204/16 |
| 4,052,787 | 10/1977 | Shaheen et al. | 29/626 |
| 4,962,058 | 10/1990 | Cronin et al. | 437/187 |
| 5,324,683 | 6/1994 | Fitch et al. | 437/65 |
| 5,328,868 | 7/1994 | Conti et al. | 437/203 |
| 5,444,015 | 8/1995 | Aitken et al. | 437/182 |
| 5,461,003 | 10/1995 | Havemann et al. | 437/187 |
| 5,476,817 | 12/1995 | Numata | 437/195 |
| 5,486,493 | 1/1996 | Jeng | 437/195 |
| 5,510,293 | 4/1996 | Numata | 437/195 |
| 5,510,645 | 4/1996 | Fitch et al. | 257/522 |
| 5,519,250 | 5/1996 | Numata | 257/632 |
| 5,550,068 | 8/1996 | Hirano et al. | 437/41 |
| 5,559,055 | 9/1996 | Chang et al. | 437/195 |
| 5,591,677 | 1/1997 | Jeng | 437/195 |
| 5,616,959 | 4/1997 | Jeng | 257/758 |
| 5,625,232 | 4/1997 | Numata et al. | 257/758 |
| 5,639,686 | 6/1997 | Hirano et al. | 437/189 |
| 5,668,398 | 9/1997 | Havemann et al. | 257/522 |
| 5,675,187 | 10/1997 | Numata et al. | 257/758 |
| 5,750,415 | 5/1998 | Gnade et al. | 437/195 |
| 5,751,056 | 5/1998 | Numata | 257/666 |
| 5,789,818 | 8/1998 | Havemann | 257/750 |
| 5,811,352 | 9/1998 | Numata et al. | 438/622 |
| 5,814,558 | 9/1998 | Jeng et al. | 438/623 |
| 5,953,626 | 9/1999 | Hause et al. | 438/622 |
| 5,960,316 | 9/1999 | Bai | 438/633 |
| 5,998,293 | 12/1999 | Dawson et al. | 438/619 |
| 6,001,726 | 12/1999 | Nagabushnam et al. | 438/618 |
| 6,016,000 | 1/2000 | Moslehi | 257/522 |
| 6,017,814 | 1/2000 | Grill et al. | 438/619 |

*Primary Examiner*—John F. Niebling
*Assistant Examiner*—Lynne Gurley
*Attorney, Agent, or Firm*—George O. Saile; Stephen B. Ackerman

[57] ABSTRACT

The process of the present invention can be used for conventional processing or for the Damascene process. The key concept of the present invention is a functional "filler" material which can later be removed (decomposed) to leave an air gap between the conducting lines. The filler material can be deposited as a step during conventional metal etch processing or it can be deposited as a first step of the processing of a semiconductor wafer. Leakage currents can be reduced as part of the present invention by applying passivation layers.

26 Claims, 5 Drawing Sheets

OXIDE LINER DEPOSITION
(NOT SHOWN)
*FIG. 12*
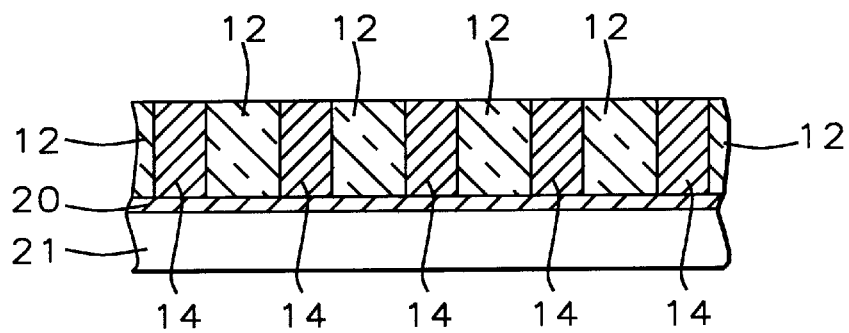
*FIG. 13*
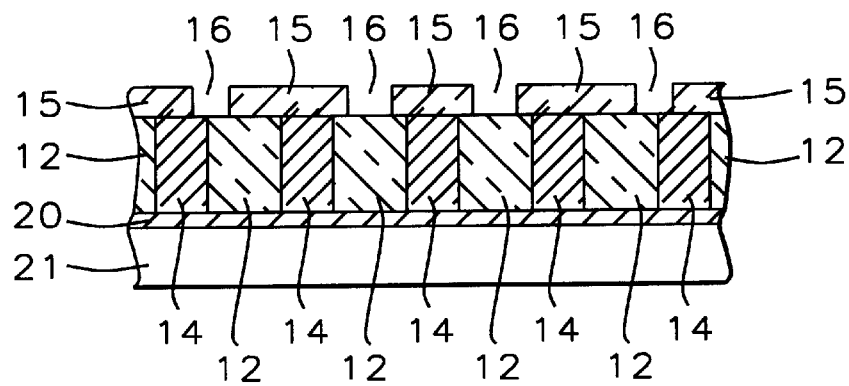
*FIG. 14*
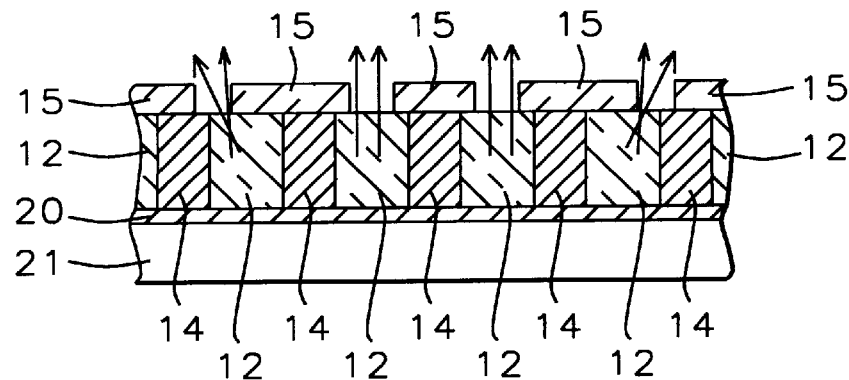
*FIG. 15*

AIR GAP FORMATION FOR HIGH SPEED IC PROCESSING

BACKGROUND OF THE INVENTION (1) Field of the Invention

The invention relates to the fabrication of Integrated Circuit devices, and more specifically to organic siloxane and silicon gel processing and the formation of air gaps as a low dielectric constant material between conductor lines.

(2) Description of the Prior Art

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The continuing effort to reduce the size of individual transistors and other devices commonly integrated on a semiconductor chip and to increase the density of Integrated Circuits results in a continuing reduction of the separation between conducting layers of materials. This reduction results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation. It becomes therefore imperative to reduce the resistive capacitance (RC) time constant and the crosstalk between adjacent conducting lines.

The capacitance between adjacent conducting lines is highly, dependent on the insulator or dielectric used to separate the conducting lines. Conventional semiconductor fabrication typically uses silicon dioxide as a dielectric, this has a dielectric constant of about 3.9.

The use of many of the low dielectric constant materials is not feasible due to the fact that equipment is not available to properly process the new dielectric materials in various integrated circuits. Also, the chemical or physical properties of many low dielectric constant materials are usually difficult to make compatible with or integrate into conventional integrated circuit processing.

The lowest possible and therefore the ideal dielectric constant is 1.0, this is the dielectric constant of a vacuum whereas air has a dielectric constant of less than 1.001.

To reduce capacitive coupling and to reduce capacitive crosstalk, a major objective in the design of IC's is to reduce the Dielectric Constant (k) of the insulating layer between adjacent conductor lines of semiconductor circuits. The present invention makes a significant contribution within the scope of this effort.

U.S. Pat. No. 5,750,415 to Gnade et al. shows a method of forming air gaps between metal lines 16 by etching out a filler material, e.g. a disposable liquid layer 18. The disposable liquid layer 18 is removed from between the metal lines with the help of a porous silica precursor film 20 which gels to form a low-porosity silica film 24. The process and materials used in this procedure are different than those used as part of the present invention.

U.S. Pat. No. 5,461,003 to Havemann et al. shows a method of forming air gaps between metal lines 16 by etching out a filler material, e.g. a disposable liquid layer 18. The disposable liquid layer 18 is removed from between the metal lines with the help of a porous dielectric layer 20. The process and materials used in this procedure are different from those used as part of the present invention. This procedure also differs from the present invention in that no openings are formed in the overlying dielectric layer to etch out the filler material.

U.S. Pat. No. 5,668,398 to Havemann et al., the same comments apply to this patent as previously made regarding U.S. Pat. No. 5,461,003. This patent uses a disposable solid layer 18.

U.S. Pat. No. 5,324,683 to Fitch et al. shows a method of forming air gaps by selectively removing a sacrificial spacer (16a and 16b) or by selectively removing a sacrificial layer (28, 40). This removal is accomplished by etching while the layer and spacer material are different than those used for the present invention.

U.S. Pat. No. 5,510,645 to Pitch et al., the same comments apply to this patent as previously made regarding U.S. Pat. No. 5,324,683.

SUMMARY OF THE INVENTION

A principle object of the present invention is to provide an effective and very manufacturable method of forming air-gaps between conductive layers of material.

Another object of the present invention is a method of reducing the dielectric constant k material between conductive layers of material.

Another objective of the present invention is a method of reducing capacitive coupling between conductive layers of material.

Another objective of the present invention is a method of reducing capacitive cross-talk between conductive layers of material.

Another objective of the present invention is to reduce the potential for false or incorrect logic levels of the circuits in the IC.

Another objective of the present invention is a method of reducing Resistive Capacitive (RC) delays of the circuits in the IC.

Another objective of the present invention is to increase the Switching Speed of the circuits in the IC.

In accordance with the objects of the present invention a new method of forming air gaps between adjacent conducting lines of a semiconductor circuit is achieved.

The first embodiment of the present invention includes a method for forming air gaps between conducting leads of a semiconductor device. A pattern of conducting lines is deposited on a base layer. A disposable filler layer is first deposited between the conducting lines, the disposable filler layer is etched back to the top surface of the pattern of conducting lines. A layer of dielectric films, silicon oxide or silicon nitride is deposited over the filler material, vent holes are opened in this dielectric film. The filler material is removed after which inter-metal dielectric is deposited which is polished for completion of the process.

FIG. 18 shows a second embodiment of the present invention in which a passivating layer 22 passivates the sidewalls of the metal leads 11 and the exposed portions of the oxide layer 20.

FIG. 19 shows a third embodiment of the present invention in which a passivating layer 22 passivates the sidewalls of the metal conductors 11. This embodiment of the present invention involves exposing the metal leads to a gas to react and form a passivating layer only around the metal leads 11.

The fourth embodiment of the present invention includes a method for first depositing the filler material on the base material. After this deposition, the metal deposition takes place, this metal deposition forms the conductor lines. A layer of silicon oxide is now deposited, vent holes are created in this oxide layer. The filler material is removed, an inter-metal oxide layer is deposited which is polished for completion of the process.

Advantages of the Present Invention an effective method of forming air-gaps between conductive layers of material.

a method of reducing the dielectric constant k between conductive layers of material.

a method of reducing capacitive coupling between conductive layers of material.

a method of reducing capacitive cross talk between conductive layers of material.

a method to reduce the potential for false or incorrect logic levels of the circuits in the IC.

a method of reducing Resistive Capacitive (RC) delays of the circuits in the IC.

a method to increase the switching speed of the circuits in the IC.

BRIEF DESCRIPTION OF THE DRAWINGS

The first embodiment of the present invention comprises a method for forming air-gaps between conducting lines by first depositing the conducting lines. A functional filler material, which can later be decomposed, is added at a later processing step within the first embodiment of the present invention.

The second and third embodiment of the present invention provide a method of reducing leakage currents by means of passivating layers around the conductor leads and part of the oxygen layer which is part of the base layer.

The fourth embodiment of the present invention comprises a method for forming air-gaps between conducting lines by first depositing a functional filler material which can later be decomposed leaving an air gap between the conducting lines.

In the accompanying drawings, forming a material part of this description, there is shown:

FIGS. 1 through 9 schematically illustrate in cross-sectional representation of the first preferred embodiment of the process of the present invention.

FIGS. 10 through 17 schematically illustrate in cross-sectional representation of the fourth preferred embodiment of the process of the present invention.

Figure 18:
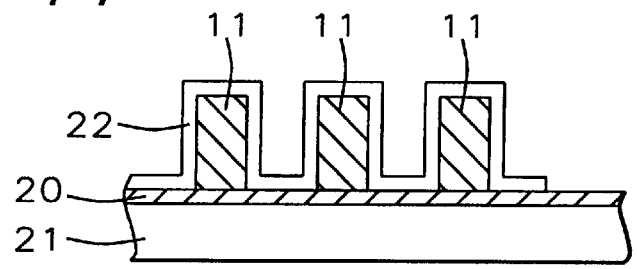
Figure 19:
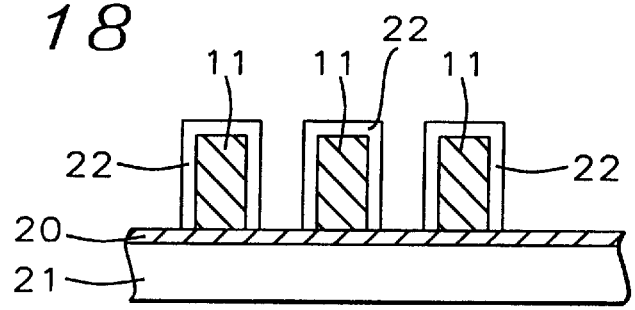

FIGS. 18 and 19 respectively refer to the second and third embodiment of the present invention.

DETAILED DESCRIPTION OF THE PREFERRED EMBODIMENTS

The making and use of the presently preferred embodiments are discussed below in detail. However, it should be appreciated that the present invention provides many applicable inventive concepts that can be combined in a wide variety of specific contexts. The specific embodiments discussed are merely illustrative of specific ways to make and to use the present invention, and do not delimit the scope of the invention.

The following is a description of embodiments, including manufacturing methods.

FIGS. 1 through 9 relate to the first embodiment of the present invention.

Figure 1:
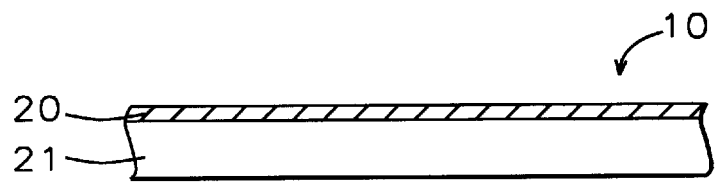

Referring now more particularly to FIG. 1, there is shown a cross-sectional view of a semiconductor wafer 10 having a substrate 21 and a base layer 20. The substrate 21 may, for example, contain transistors, diodes, and other semiconductor elements (not shown) as are well known in the art. The substrate 21 may also contain metal interconnect layers. The substrate 21 is, preferably, made of silicon, which is typically single crystalline. The substrate can also be made of gallium arsenide, silicon on sapphire, epitaxial formations, germanium, germanium silicon, diamond, silicon on insulator dioxide. The base layer 20 can also contain other dielectric materials.

In general, base layer 20 illustrates that the present invention of forming air gaps between adjacent conducting metal lines of a semiconductor circuit may be applied on any level within the integrated circuit.

Figure 2:
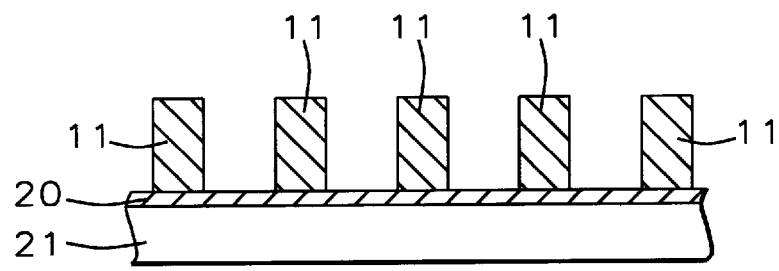

FIG. 2 shows the metal conductive material 11 after deposition onto the base layer 20. In a preferred form, the regions 11 are conductive regions such as a metal, a silicate, a salicide, poly-silicon, amorphous silicon or any other semiconductor compatible conductive layer. This cross-section can indicate any level of conducting lines that needs to be isolated and is etched in a predetermined pattern to form metal leads.

Figure 3:
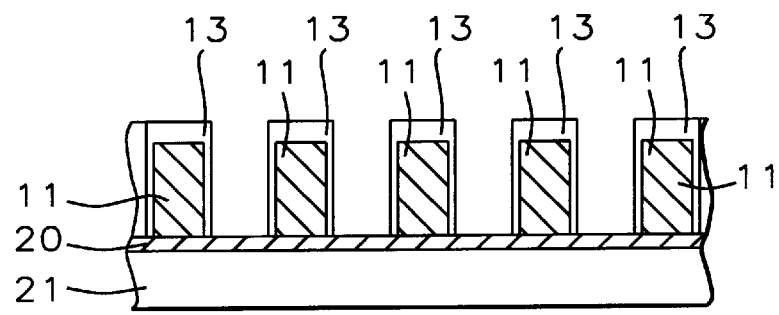

FIG. 3 shows the deposition of a silicon oxide liner 13, this step is optional.

Figure 4:
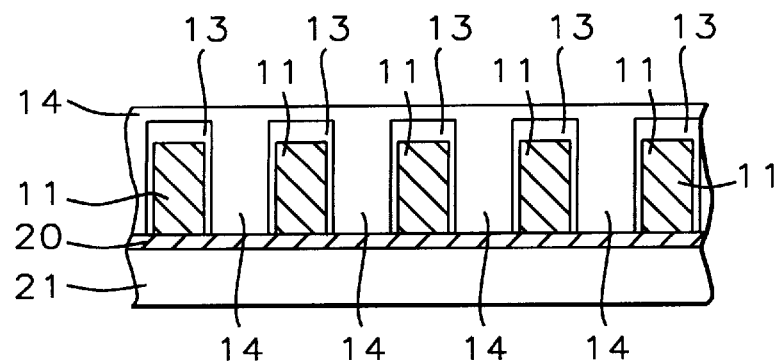

FIG. 4 shows the deposition of the filler material 14. This filler material as used within the context of the present invention consists of organic siloxane or silicon gels. The method of deposition is not critical and can be Physical Vapor Deposition (PVD), Chemical Vapor Deposition (CVD), spin-on material, etc. The disposable layer 14 may, for example, be spun onto the wafer at a slow speed to a height of approximately two times the height of the metal leads in order to fill all spaces between the metal leads with the filler material.

As filler material any material, that is organic or inorganic, can be used as long as the filler material has a melting temperature such that the dielectric deposition can be done below the melting point of the filler material. The filler material melting temperature must be below approximately 500 degrees C., the device wafer can sustain this temperature. This limits the melting temperature of the filler material to a range of between 50 and 500 degrees C.

The melting temperature of the filler material determines its coating process. PVD or CDV is the preferred coating process for filler material with a high melting temperature while spin coating is the preferred coating process for filler material with a low melting temperature.

Figure 5:
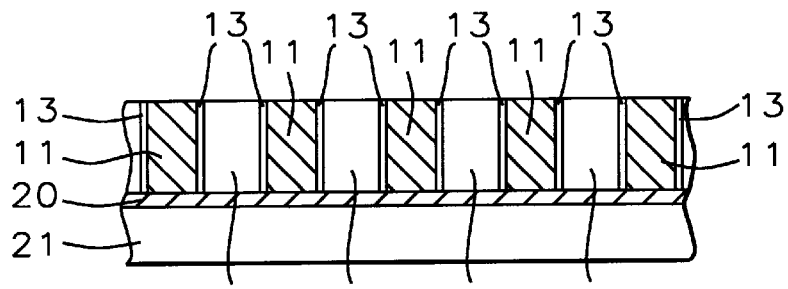

FIG. 5 shows the cross-section after a chemical or mechanical etch back has been performed. This etch back can, for instance, be performed by spinning the wafer at a higher rate of speed to remove some of the filler material 14 (by centrifugal force). This etch back has removed the upper part (the part furthest away from the base layer) of the filler material and the silicon oxide liner. The top of the conductive material (the area furthest removed from the substrate) is only nominally affected by this etch back while the silicon oxide liner and the filler material which have previously been deposited between the conducting lines remain unaffected.

Figure 6:
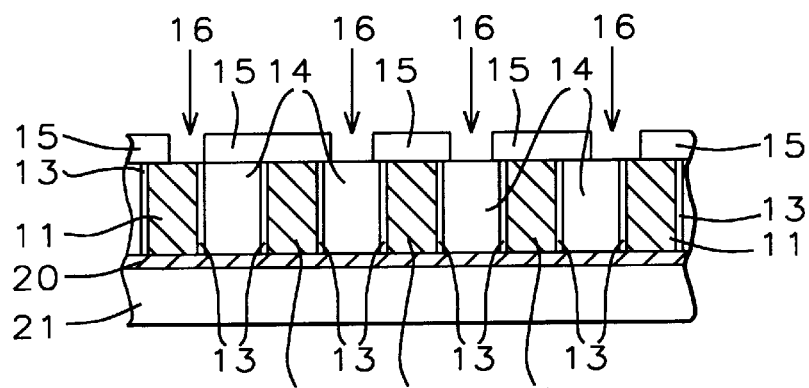

FIG. 6 shows the cross-section after the deposition of a silicon oxide layer (cap oxide) 15 and the selectively opening of holes 16 by means of conventional Photo Resist (PR) masking. The selective opening of holes 16 does not effect the underlying layer of filler material or the conducting lines.

The thermal heating process to remove the filler material is an oven baking with or without a vacuum or a rapid thermal heating process. The filler material is evaporated in this way.

The radiation process to remove the filler material is an electron or ion beam bombardment in vacuum.

The photo-optical process to remove the filler material is an optical illumination of the wafer using a range of various wavelengths during this illumination.

Other methods to remove the filler material is to use a chemical removal process, for instance the use of HF solution with a SiN liner and cap.

Figure 7:
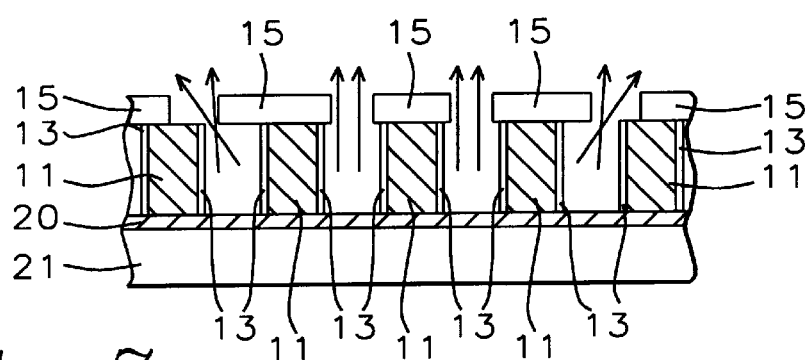

FIG. 7 shows the cross-section of the removal of the filler material 14. This removal process step can use any method for the removal such as thermal (heat), electrical, optical, high-energy particle beam, etc. Air gaps 18 (shown in FIG. 8) are now formed between the conducting lines.

Figure 8:
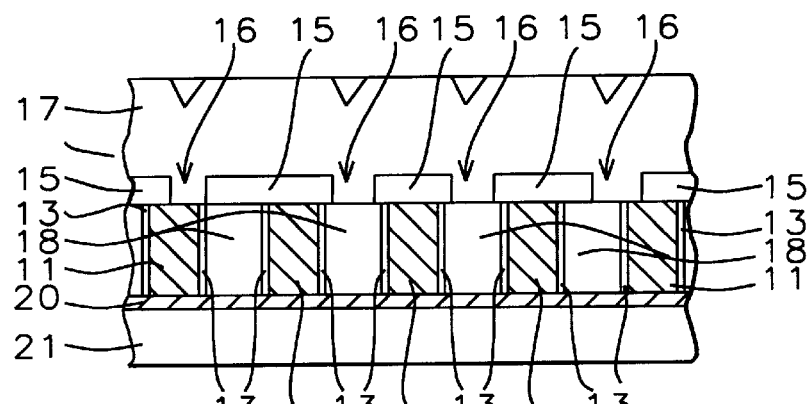

FIG. 8 shows the deposition of the inter-metal oxide layer 17.

Figure 9:
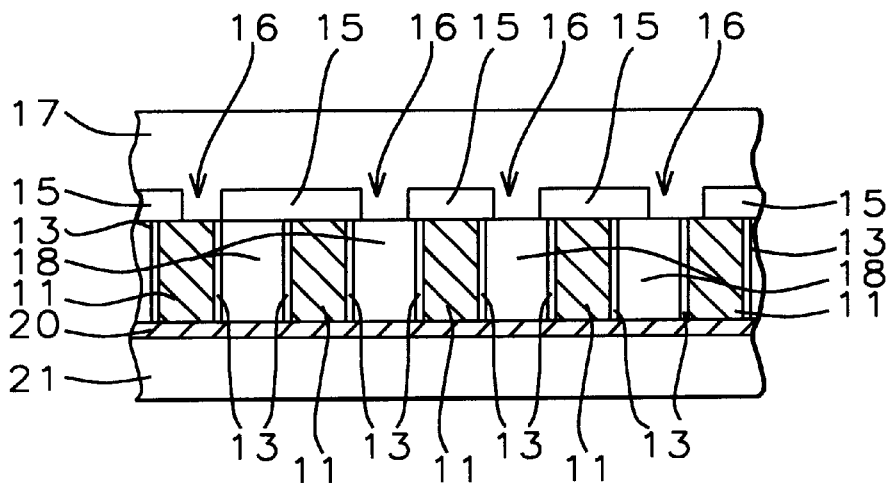

FIG. 9 shows the completed procedure after conventional Chemical/Mechanical polishing and planarization. The metal oxide 17 does not penetrate through the vent holes into the spaces between the conducting lines 11 as long as the processing temperature remains below the melting point of the metal oxide, for aluminum for instance this temperature is approximately 677 degrees C.

FIGS. 18 and 19 respectively address the second and third embodiment of the present invention.

Referring first to FIG. 18, oxide layer 20 and metal leads 11 may have active surfaces that can act as paths for leakage current if left un-passivated. FIG. 18 shows an alternate embodiment in which a (for example uniform) passivating layer 22 passivates both exposed surfaces of oxide layer 20 and metal leads 22 to prevent inter-lead leakage.

FIG. 19 indicates that the passivating layer 22 is formed around the metal leads only. This involves exposing the metal leads to a gas to react and form the passivating layer 22.

FIGS. 10 through 17 relate to the fourth embodiment of the present invention.

Figure 10:
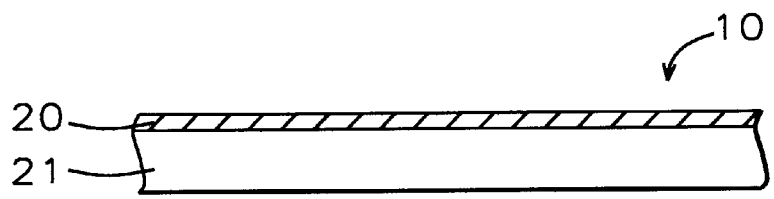

FIG. 10 shows a base layer 20 on the surface of semiconductor wafer 10. The same comments apply to the semiconductor wafer 10 regarding base layer 20 and the substrate 21 as were previously made under the detailed description of FIG. 1.

Figure 11:
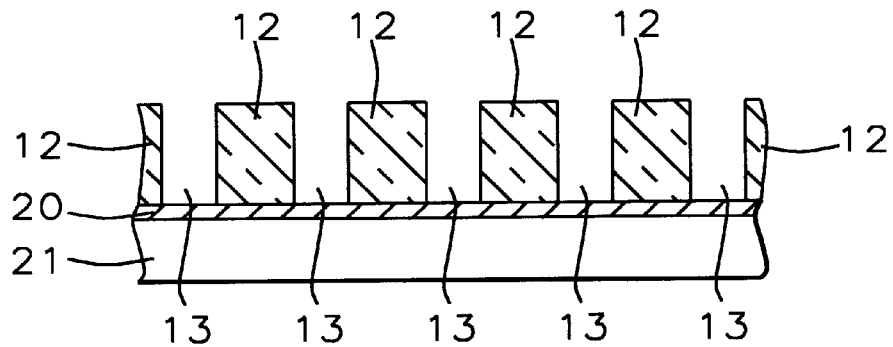

FIG. 11 shows a cross-section after the filler material 12 has been deposited and after the trench formation 13 has been completed. The filler material used is organic siloxane or silicon gels. The method used for the deposition of the filler material is not critical and can be Physical Vapor Deposition (PVD), Chemical Vapor Deposition (CVD), spin on material, etc. The method used for the formation of the trenches is also not critical, standard semiconductor trench formation techniques such as Photo Resist (PR) masking can be applied.

At this point in the process a silicon oxide liner may be deposited. This step is optional and is therefore not shown as part of the drawings under discussion. As a further extension of the present invention the need may arise to implement passivation layers as part of this process. This if leakage currents between the layer of the to be deposited metal lines and the oxide layer which forms part of the base layer become a problem. These passivation layers may be directly deposited on top of the base layer, to lay the groundwork for insulating adjacent conductor leads, and be further extended by providing a passivating layer around the filler material. This latter passivation layer would remain part of the structure even after the filler material is removed from the substrate in a subsequent processing step. These processing steps are akin to the steps illustrated in FIGS. 18 and 19 but are slightly modified from these figures so as to encapsulate the later to be deposited conductor lines at this point.

FIG. 13 shows the cross-section after metal deposition 14 and etch back. The method used for the deposition of the metal layer is not critical, any current metal deposition method can be applied. The method used for the etch back of the metal is also not critical.

FIG. 14 shows the cross-section after a silicon oxide layer (cap) 15 has been deposited and vent holes 16 have been fabricated.

FIG. 15 shows the removal of the filler material 12. Any of the methods as indicated above under the description of the conventional processing method can be used for this processing step.

Figure 16:
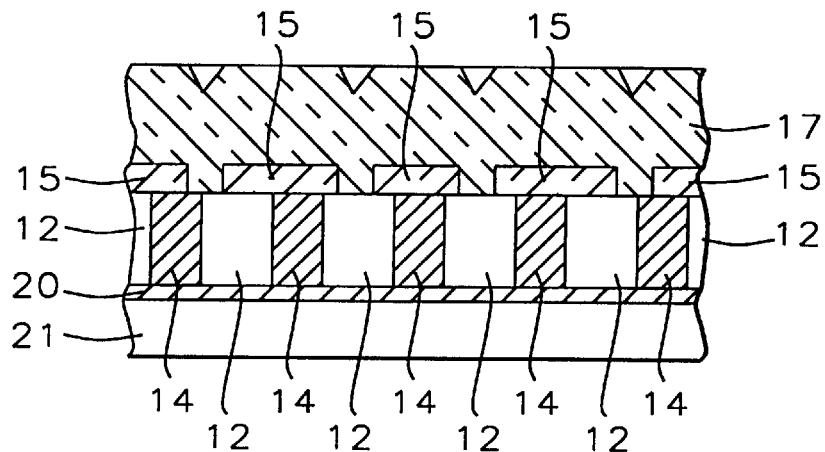

FIG. 16 shows the deposition of the inter metal oxide 17.

Figure 17:
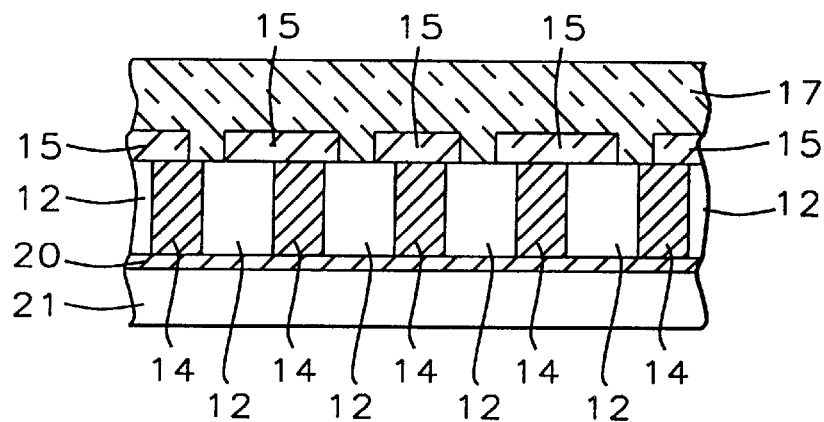

FIG. 17 shows the cross-section after final polishing and planarization has been completed.

FIGS. 18 and 19 respectively refer to the second and third embodiment of the present invention.

Referring first to FIG. 18, oxide layer 20 and metal leads 11 may have active surfaces which can act as paths for leakage current if left un-passivated. FIG. 18 shows an alternate embodiment in which a (for example uniform) passivating layer 22 passivates both exposed surfaces of oxide layer 20 and metal leads 22 to prevent inter-lead leakage.

FIG. 19 indicates that the passivating layer 22 is formed around the metal leads only. This involves exposing the metal leads to a gas to react and form the passivating layer 22.

The present invention offers a method of forming air gaps between adjacent conducting lines within a semiconductor circuit by using organic siloxane or silicon gels for filler material. The air gaps have a low dielectric constant and result in reduced crosstalk between adjacent conducting lines of semiconductor circuits.

While the present invention has been described with reference to illustrative embodiments, this description is not to be construed in a limiting sense. Various modifications and combinations, as well as other embodiments of the invention, will be apparent to those skilled in the art of semiconductor manufacturing and design upon reference to the descriptions. It is therefore intended that the appended claims encompass any such modifications or embodiments.

What is claimed is:

1. A method of forming air gaps between metal leads of a semiconductor device, comprising the steps of:

securing a semiconductor wafer;

forming a base layer on said semiconductor wafer;

depositing a metal layer on said base layer;

etching said metal layer in a pattern to form metal leads, said metal leads having tops and sidewalls, wherein portions of said substrate base layer are exposed;

depositing a disposable filler material on said metal leads and said exposed portions of said substrate base layer;

removing a top portion of said disposable filler material to lower said disposable filler material to a level at least as low as said tops of said metal leads;

depositing a silicon oxide layer over said layer of metal lines and said disposable filler material;

etching vent holes in the silicon oxide layer in a pattern such that each filler material deposition has access to at least one vent hole;

removing the filler material to form said air gaps between said metal leads;

depositing an inter-metal oxide layer over said silicon oxide layer; and performing Chemical Mechanical Planarization of the inter-metal oxide layer.

2. The method of claim 1 further comprising the step of forming a passivating layer on the sides of said metal leads, after said step of etching said metal layer in a pattern to form metal leads.

3. The method of claim 1 further comprising the step of forming a passivating layer between the metal leads and on top of said exposed portion of said substrate base layer in addition to a passivating layer on the sidewalls of said metal leads, after said step of etching said metal layer in a pattern to form metal leads.

4. The method of claim 1 where said disposable filler material contains organic siloxane.

5. The method of claim 1 where said disposable filler material contains silicon gels.

6. The method of claim 1 where said disposable filler material contains an organic or inorganic material that has a melting point within the range between 50 and 500 degrees C.

7. The method of claim 1 wherein said filler material exhibits high melting point characteristics said filler material being deposited using PVD or CVD process technology.

8. The method of claim 1 wherein said filler material exhibits low melting point characteristics said filler material being deposited using spin coating process technology.

9. The method of claim 1 wherein the method of removing said disposable filler material is based on using high-energy electron or ion particle beam technology said high-energy particle beam technology to contain electron beam or ion beam bombardment in vacuum.

10. The method of claim 1 wherein the method of removing said disposable filler material is performed by using photo-optic technology said technology to contain illumination of the wafer using a range of wavelengths.

11. The method of claim 1 wherein the method of removing said disposable filler material is performed by using thermal heating technology said technology to contain oven baking with or without vacuum.

12. The method of claim 1 wherein the method of removing said disposable filler material is performed by using thermal heating technology said technology to contain rapid thermal heating.

13. The method of claim 1 wherein the method of removing said disposable filler material is performed by using chemical removal of said filler material.

14. The method of claim 2 wherein said passivating layer contains a nitride.

15. The method of claim 3 wherein said passivating layer contains a nitride.

16. The method of claim 1 further comprising the step of depositing a structural dielectric layer after said removing of said filler material.

17. A method of forming air gaps between adjacent conducting leads of a semiconductor device, comprising the steps:

securing a semiconductor wafer;

forming a base layer on said semiconductor wafer;

depositing a filler material on said base layer;

etching said filler material layer into a pattern said pattern being the mirror image of the metal lead pattern of the circuit pattern which is to be etched into the semiconductor;

depositing a metal material between said filler material pattern and on top of the exposed portion of said substrate surface;

removing a top portion of said metal material to lower said metal material to a level at least as low as the top surface of said filler material;

depositing a silicon oxide layer over said layer of metal lines and disposable filler material;

opening vent holes in said silicon oxide layer;

removing the filler material through said vent holes to form air gaps between said metal leads beneath said silicon oxide layer;

depositing an inter-metal oxide layer; and performing Chemical Mechanical Planarization of said inter-metal oxide layer.

18. The method of claim 17 where the disposable filler material contains organic siloxane.

19. The method of claim 17 where the disposable filler material contains silicon gels.

20. The method of claim 17 where the disposable filler material contains an organic or inorganic material that has a melting point within the range between 50 and 500 degrees C.

21. The method of claim 17 wherein said method of removing said disposable filler material is based on using high-energy particle beam technology.

22. The method of claim 17 wherein said method of removing said disposable technology filler material is performed by using photo-optic technology.

23. The method of claim 17 wherein the method of removing said disposable filler material is based on using high-energy particle beam technology.

24. The method of claim 17 wherein the method of removing said disposable filler material is performed by using thermal, radiative or chemical techniques.

25. The method of claim 17 further comprising the step of forming a passivation layer on the sidewalls of said filler material deposition, after said step of etching said filler material in a pattern which is the mirror image of the pattern of said metal leads for the semiconductor circuits.

26. The method of claim 17 further comprising the step of depositing a structural electric layer, after said step of removing of said disposable filler material.

* * * * *